(12) United States Patent
Liao et al.

(10) Patent No.: US 10,784,259 B2
(45) Date of Patent: Sep. 22, 2020

(54) SEMICONDUCTOR DEVICE AND METHOD OF MANUFACTURING THE SAME

(71) Applicant: Powerchip Semiconductor Manufacturing Corporation

(72) Inventors: Hung-Kwei Liao, Taoyuan (TW); Chen-Chiang Liu, Hsinchu County (TW); Kuo-Sheng Shih, Hsinchu (TW); Yung-Yao Shih, Hsinchu (TW); Ming-Tsung Hsu, Chiayi County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/357,343

(22) Filed: Mar. 19, 2019

(65) Prior Publication Data

US 2020/0219876 A1    Jul. 9, 2020

(30) Foreign Application Priority Data

Jan. 4, 2019    (TW) .............................. 108100348 A

(51) Int. Cl.
*H01L 21/02*    (2006.01)
*H01L 21/265*    (2006.01)
(Continued)

(52) U.S. Cl.
CPC ........ *H01L 27/092* (2013.01); *H01L 21/0217* (2013.01); *H01L 21/0274* (2013.01);
(Continued)

(58) Field of Classification Search
CPC ............. H01L 27/092; H01L 21/02164; H01L 21/0217; H01L 21/0274; H01L 21/26513;
(Continued)

(56) References Cited

U.S. PATENT DOCUMENTS 7,417,283 B2    8/2008    Chun
7,528,451 B2    5/2009    Zhu et al.
(Continued)

FOREIGN PATENT DOCUMENTS

TW    201843812    12/2018

OTHER PUBLICATIONS

"Office Action of Taiwan Counterpart Application," dated Jul. 31, 2019, p. 1-p. 4.

*Primary Examiner* — Tong-Ho Kim
(74) *Attorney, Agent, or Firm* — JCIPRNET

(57) ABSTRACT

Provided is a semiconductor device including a substrate, an isolation structure, a barrier structure, a first conductive layer, a second conductive layer, a first gate dielectric layer, and a second gate dielectric layer. The substrate has a first region and a second region. The barrier structure is located on the isolation structure. The first conductive layer is located on the first region. The second conductive layer is located on the second region. The first gate dielectric layer is located between the first conductive layer and the substrate in the first region. The second gate dielectric layer is located between the second conductive layer and the substrate in the second region. The first gate dielectric layer and the second gate dielectric layer are separated by the isolation structure. A method of manufacturing the semiconductor device is also provided.

9 Claims, 21 Drawing Sheets

(51) Int. Cl.
*H01L 21/28* (2006.01)
*H01L 21/311* (2006.01)
*H01L 21/321* (2006.01)
*H01L 21/8238* (2006.01)
*H01L 27/092* (2006.01)
*H01L 29/40* (2006.01)
*H01L 29/49* (2006.01)
*H01L 21/3215* (2006.01)
*H01L 21/027* (2006.01)

(52) U.S. Cl.
CPC .. *H01L 21/02164* (2013.01); *H01L 21/26513* (2013.01); *H01L 21/28052* (2013.01); *H01L 21/31116* (2013.01); *H01L 21/31144* (2013.01); *H01L 21/3212* (2013.01); *H01L 21/32155* (2013.01); *H01L 21/823835* (2013.01); *H01L 21/823857* (2013.01); *H01L 21/823878* (2013.01); *H01L 29/401* (2013.01); *H01L 29/4933* (2013.01)

(58) Field of Classification Search
CPC ......... H01L 21/28052; H01L 21/31116; H01L 21/31144; H01L 21/3212; H01L 21/32155; H01L 21/823835; H01L 21/823857; H01L 21/823878; H01L 29/401; H01L 29/4933
USPC ...................................................... 257/369
See application file for complete search history.

(56) References Cited

U.S. PATENT DOCUMENTS

| | | | |
|---|---|---|---|
| 7,812,400 B2 | 10/2010 | Liaw | |
| 2008/0157215 A1* | 7/2008 | Miyashita | H01L 21/28123 257/374 |
| 2008/0290415 A1* | 11/2008 | Okazaki | H01L 21/823835 257/365 |
| 2014/0001540 A1* | 1/2014 | Wang | H01L 29/66666 257/329 |
| 2014/0015064 A1* | 1/2014 | Bu | H01L 27/092 257/369 |

* cited by examiner

SEMICONDUCTOR DEVICE AND METHOD OF MANUFACTURING THE SAME

CROSS-REFERENCE TO RELATED APPLICATION

This application claims the priority benefit of Taiwan Patent Application No. 108100348, filed on Jan. 4, 2019. The entirety of the above-mentioned patent application is hereby incorporated by reference herein and made a part of this specification.

BACKGROUND OF THE INVENTION

Field of the Invention

The invention relates to an integrated circuit and a manufacturing method thereof, and more particularly, to a semiconductor device and a method of manufacturing the same.

Description of Related Art

In integrated circuit fabrication techniques, performing a pre-doping implantation process on the polysilicon reduces the resistance of the polysilicon. In addition, this pre-doping implantation process can also reduce the poly depletion phenomenon.

However, as the integrated circuit becomes smaller and smaller, after the pre-doping implantation process and the annealing process, the inter-diffusion in the polysilicon gate region between the N-Metal Oxide Semiconductor (NMOS) device and the P-type metal oxide semiconductor (PMOS) device will become more serious. The inter-diffusion will affect the threshold voltage and further limit the development of future miniaturized devices. Therefore, how to provide a semiconductor device and a manufacturing method thereof to reduce the inter-diffusion of the polysilicon gate region between the NMOS device and the PMOS device, becomes an important issue.

SUMMARY OF THE INVENTION

The present invention provides a semiconductor device which of forming a barrier structure between a first conductive layer and a second conductive layer to reduce the inter-diffusion between the first conductive layer and the second conductive layer and improve the control of the threshold voltage, thereby enhancing the ability to miniaturize semiconductor devices.

The invention provides a semiconductor device and a method of manufacturing the same which by using a damascene process to form a first conductive layer and a second conductive layer to avoid the plasma induced damage (PID), thereby improving the product reliability.

The invention provides a substrate, an isolation structure, a barrier structure, a first conductive layer, a second conductive layer, a first gate dielectric layer, and a second gate dielectric layer. The substrate has a first region and a second region. The barrier structure is located on the isolation structure. The first conductive layer is located on the first region. The second conductive layer is located on the second region. The first gate dielectric layer is located between the first conductive layer and the substrate in the first region. The second gate dielectric layer is located between the second conductive layer and the substrate in the second region. The first gate dielectric layer and the second gate dielectric layer are separated by the isolation structure.

The invention provides a manufacturing method of a semiconductor device including the following steps. An isolation structure is formed in a substrate to divide the substrate into a first region and a second region. A barrier material is blanketly formed on the substrate. The barrier material is patterned to form a first opening, a second opening, and a barrier structure between the first opening and the second opening. A first gate dielectric layer is formed in the first opening and a second gate dielectric layer is formed in the second opening. A conductive material is formed to fill in the first opening and the second opening. A planarization process is performed on the conductive material to form a first conductive layer in the first opening and form a second conductive layer in the second opening.

Based on the above, in the present invention, the barrier structure is formed between the NMOS region and the PMOS region. In the case, the present invention is able to prevent the inter-diffusion between the gate of the NMOS device and the gate of the PMOS device while maintaining the chip usage area of the semiconductor device, thereby improving the control of the threshold voltage. As a result, the ability to miniaturize semiconductor devices is accordingly enhanced. In addition, in the present invention, the gate structure is also formed in the NMOS region and the PMOS region by a damascene process to avoid the plasma induced damage (PID), thereby improving the product reliability.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
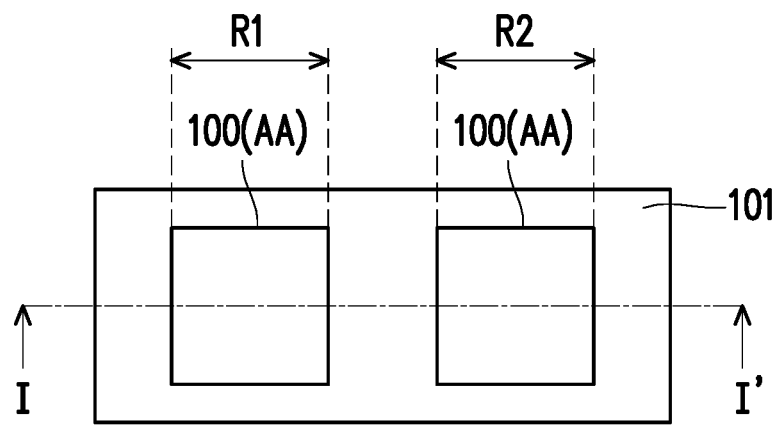
FIG. 1A to FIG. 1J are schematic top views illustrating a method of manufacturing a semiconductor device according to a first embodiment of the disclosure.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1A to FIG. 1J are schematic top views illustrating a method of manufacturing a semiconductor device according to a first embodiment of the disclosure. FIG. 2A to FIG. 2J are schematic cross-sectional views respectively taken along line I-I' of FIG. 1A to FIG. 1J. The following embodiments are described by taking a planar MOS device as an example, but the invention is not limited thereto.

Figure 2A:
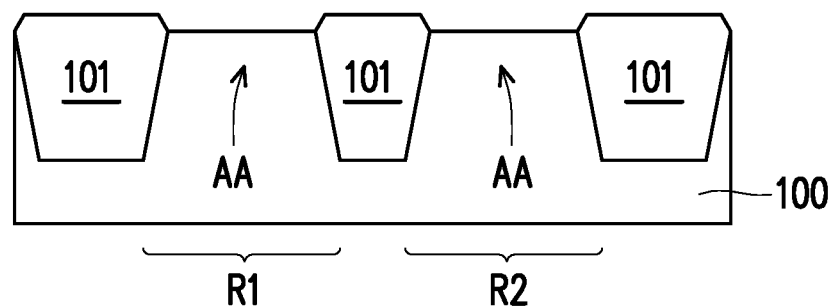
FIG. 2A to FIG. 2J are schematic cross-sectional views respectively taken along line I-I' of FIG. 1A to FIG. 1J.

The first embodiment of the present invention provides a method of manufacturing the semiconductor device including following steps. Referring to FIG. 1A and FIG. 2A, first, a substrate 100 is provided. In some embodiments, the substrate 100 is made of silicon or other semiconductor material. In addition, the substrate 100 may also include other elementary semiconductor materials, such as germanium, gallium arsenide or other suitable semiconductor materials. Further, in an alternative embodiment, the substrate 100 may also be made of an alloy semiconductor, such as silicon germanium, silicon germanium carbide, gallium arsenic phosphide or gallium indium arsenide.

An isolation structure 101 is then formed in the substrate 100 to divide the substrate 100 into a first region R1 and a second region R2. In some embodiments, the first region R1 and the second region R2 may be considered as the active region AA. As shown in the top view 1A, the isolation structure 101 surrounds the first region R1 and the second region R2. As shown in the cross-sectional view 2A, a top surface of the isolation structure 101 is higher than a top surface of the substrate 100. However, the present invention is not limited thereto. In other embodiments, the top surface of the isolation structure 101 and the top surface of the substrate 100 may also be substantially coplanar. In an embodiment, the material of the isolation structure 101 includes silicon oxide, silicon nitride, silicon oxynitride, or a combination thereof. In alternative embodiments, the isolation structure 101 may be a shallow isolation structure (STI).

Figure 1B:
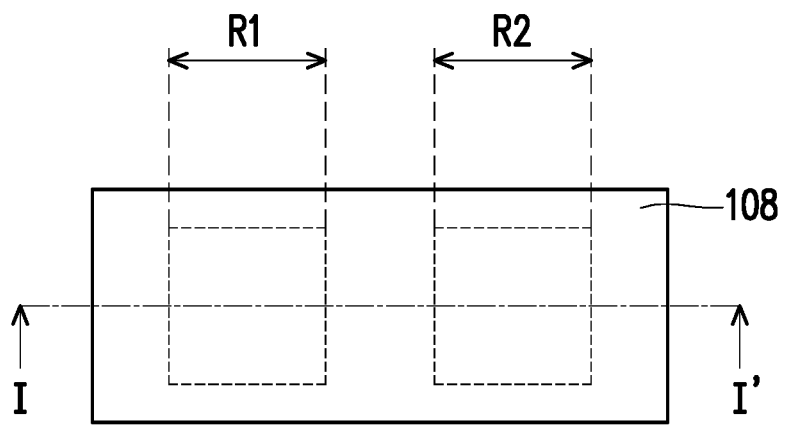
Figure 2B:
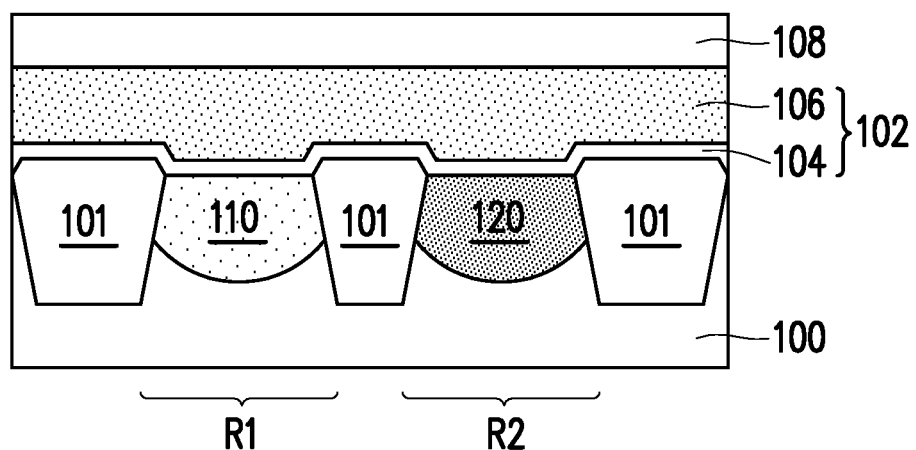

Referring to FIGS. 1B and 2B, a barrier material 102 and a dielectric layer 108 are blanketly formed on the substrate 100. Specifically, the barrier material 102 includes a first barrier layer 104 and a second barrier layer 106. The first barrier layer 104 conformally covers the surfaces of the substrate 100 and the isolation structure 101. The second barrier layer 106 covers a surface of the first barrier layer 104. The dielectric layer 108 covers a surface of the second barrier layer 106, such that the second barrier layer 106 is disposed between the dielectric layer 108 and the first barrier layer 104. In an embodiment, the first barrier layer 104 may be a sacrificial oxide (e.g., silicon oxide) which has a thickness of about 5.5 nm to 6.5 nm, and may be formed by chemical vapor deposition (CVD), furnace oxidation, atomic layer deposition (ALD), or a combination thereof, for example. The material of the second barrier layer 106 includes silicon nitride, silicon oxynitride, silicon carbide, or a combination thereof, and has a thickness of about 110 nm to 130 nm, and may be formed by CVD, ALD, or a combination thereof, for example. The material of the dielectric layer 108 includes silicon oxide, silicon nitride, silicon oxynitride, silicon carbide, or a combination thereof, and has a thickness of about 40 nm to 60 nm, and may be formed by CVD, ALD, or a combination thereof, for example. In alternative embodiments, the dielectric layer 108 and the second barrier layer 106 have different materials, and the second barrier layer 106 and the first barrier layer 104 also have different materials which benefit the subsequent patterning process of FIG. 2C to FIG. 2F. For example, the first barrier layer 104 may be a silicon oxide layer, for example; the second barrier layer 106 may be a silicon nitride layer; the dielectric layer 108 may be a tetraethosiloxane (TEOS) layer, for example.

In addition, before forming the first barrier layer 104, the method of manufacturing the semiconductor device of the present embodiment further includes forming doped regions 110, 120 in the substrate 100. In detail, the doped region 110 is located in the substrate 100 of the first region R1. The doped region 110 may be referred to as a P-type well region which may be implanted a dopant such as boron or indium (In), for example, and may have a doping concentration of $4.5 \times 10^{12}/cm^3$ to $5.5 \times 10^{12}/cm^3$, for example. The doped region 120 is located in the substrate 100 of the second region R2. The doped region 120 may be referred to as an N-type well region which may be implanted a dopant such as phosphorus, arsenic or antimony (Sb), and may have a doping concentration of $5.5 \times 10^{12}/cm^3$ to $6.5 \times 10^{12}/cm^3$, for example. In the case, the first region R1 having the P-type well region 110 may be referred to as the NMOS region domain; and the second region R2 having the N-type well region 120 may be referred to as the PMOS region.

Figure 1C:
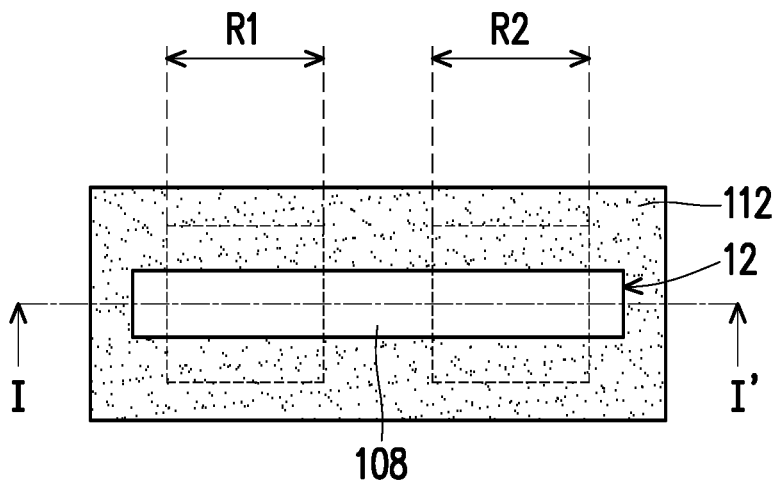
Figure 2C:
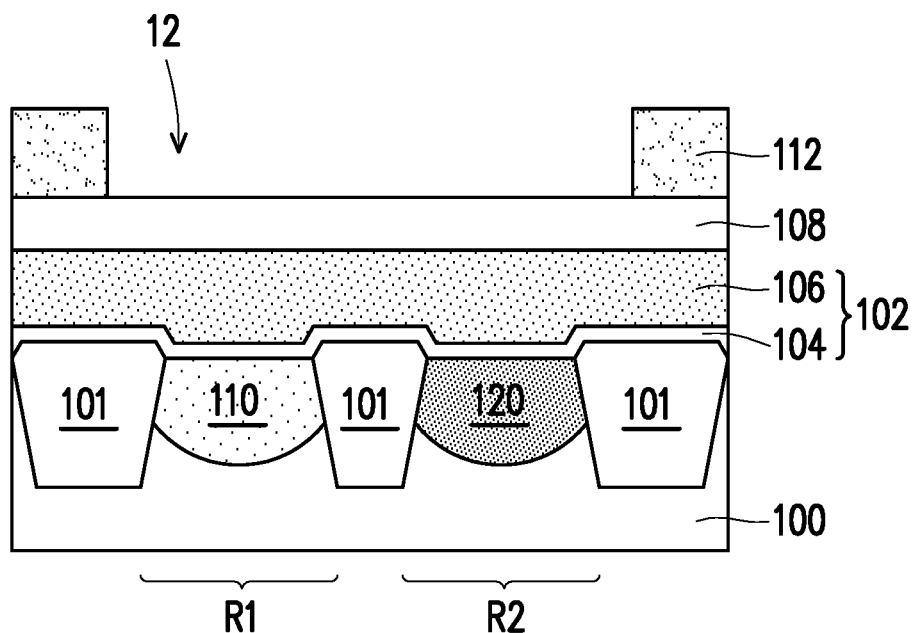
Figure 2D:
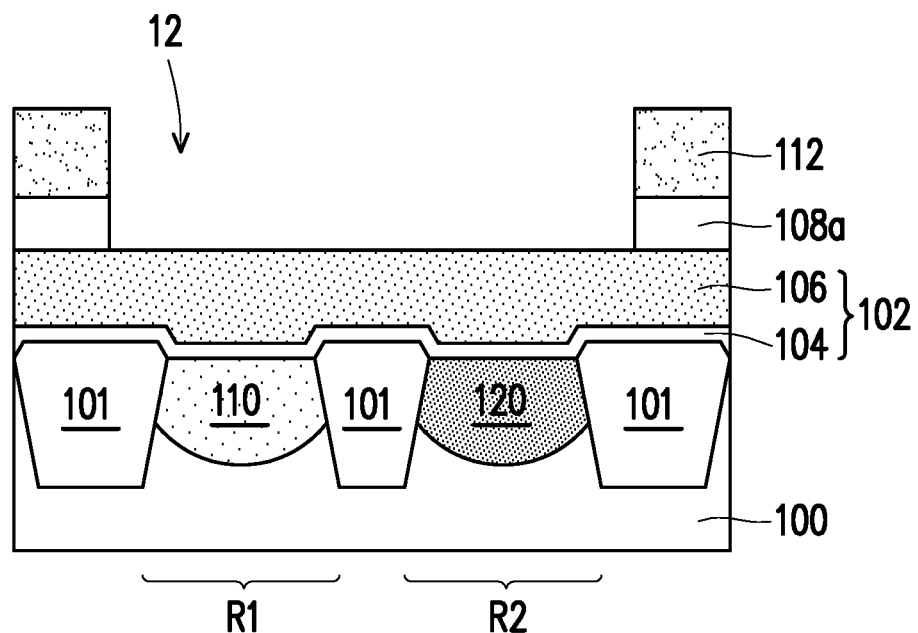

Referring to FIG. 1C and FIG. 2C, a first mask pattern 112 is formed on the dielectric layer 108. The first mask pattern 112 has a first mask opening 12. As shown in the top view 1C, the first mask opening 12 is a strip opening that exposes the first region R1, the second region R2, and the dielectric layer 108 between the first region R1 and the second region R2. In an embodiment, the material of the first mask pattern 112 includes a photoresist material, which may be formed by a spin coating method, an exposure method, and a development method.

Referring to FIGS. 1C-1D and FIGS. 2C-2D, a first etching process is performed by using the first mask pattern 112 as an etching mask to remove a portion of the dielectric layer 108, so as to expose the second barrier layer 106. In one embodiment, the first etching process includes a dry etching process, such as Reactive Ion Etching (RIE), for example. In the present embodiment, the second barrier layer 106 may be referred to as an etching stop layer of the first etching process.

Figure 1D:
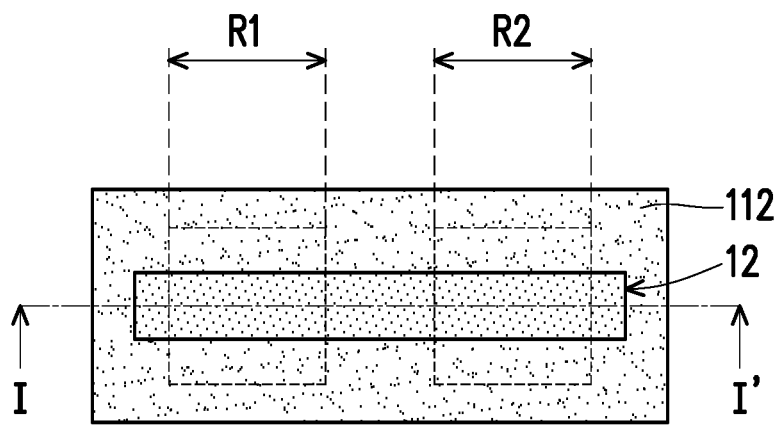
Figure 1E:
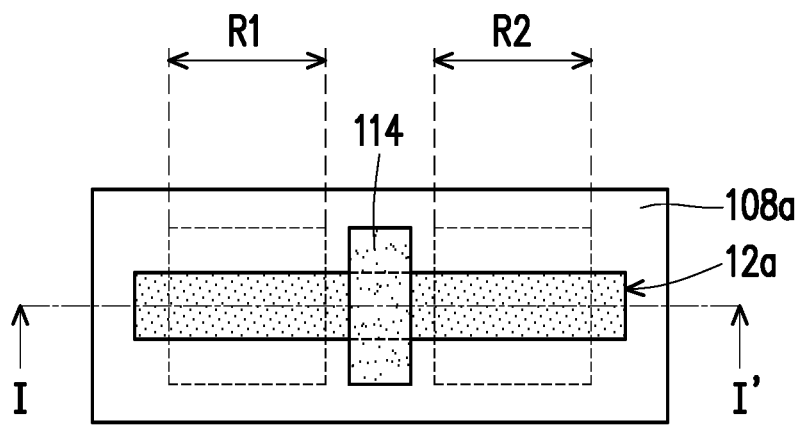
Figure 2E:
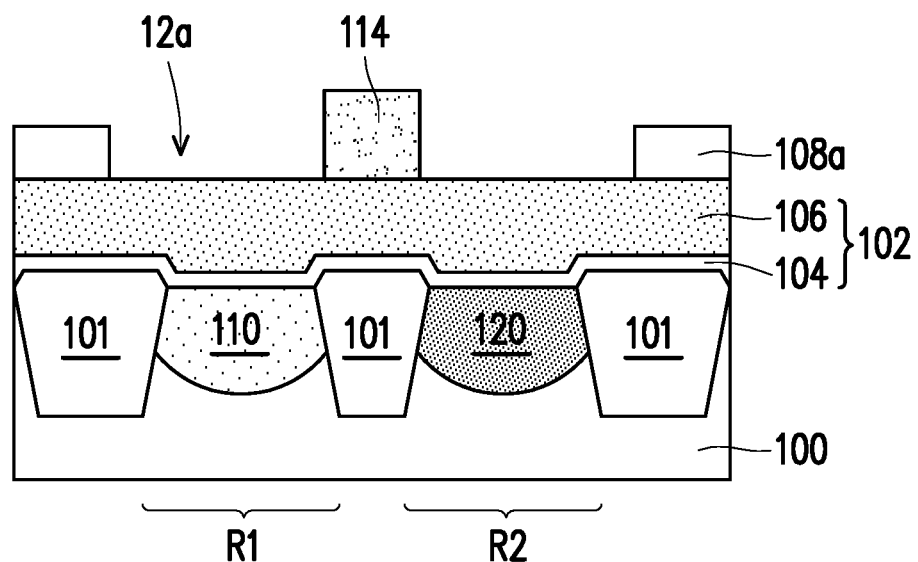
Figure 2F:
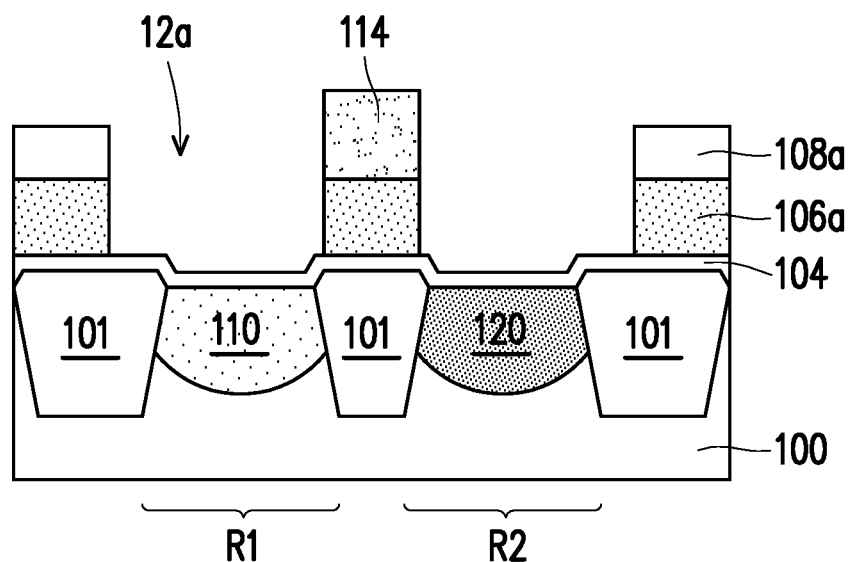

Referring to FIG. 1E and FIG. 2E, after removing the first mask pattern 112, a second mask pattern 114 is formed on the second barrier layer 106. As shown in the top view 1E, the second mask pattern 114 is located between the first region R1 and the second region R2 and across the first mask opening 12a. Herein, the first mask opening 12a duplicates the shape of the first mask opening 12 of FIG. 1C and FIG. 2C, and is defined by the dielectric layer 108a. As shown in the cross-sectional view 2E, the second mask pattern 114 corresponds to the isolation structure 101 between the first region R1 and the second region R2. In one embodiment, the material of the second mask pattern 114 includes a photoresist material, which may be formed by a spin coating method, an exposure method, and a development method.

Referring to FIGS. 1E-1F and FIGS. 2E-2F, a second etching process is performed by using the second mask pattern 114 and the dielectric layer 108a as an etching mask to remove a portion of the second barrier layer 106, so as to expose the first barrier layer 104. In an embodiment, the second etching process includes a dry etching process, such as RIE, for example. In the present embodiment, the first barrier layer 104 may be referred to as an etching stop layer of the second etching process.

Figure 1F:
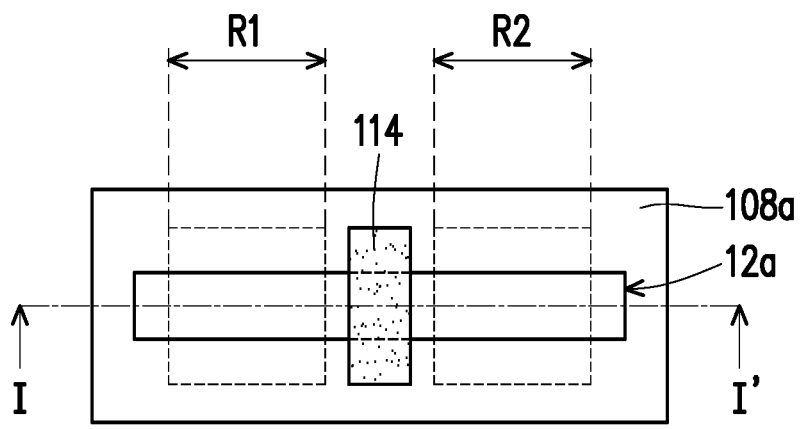
Figure 1G:
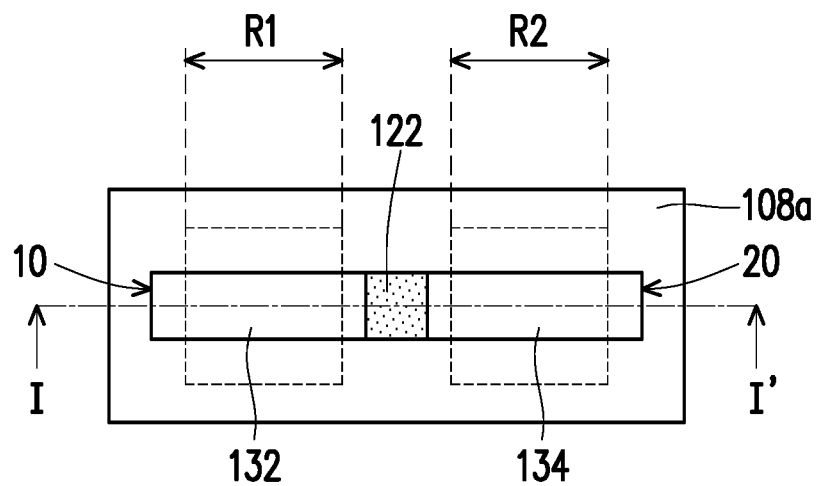
Figure 2G:
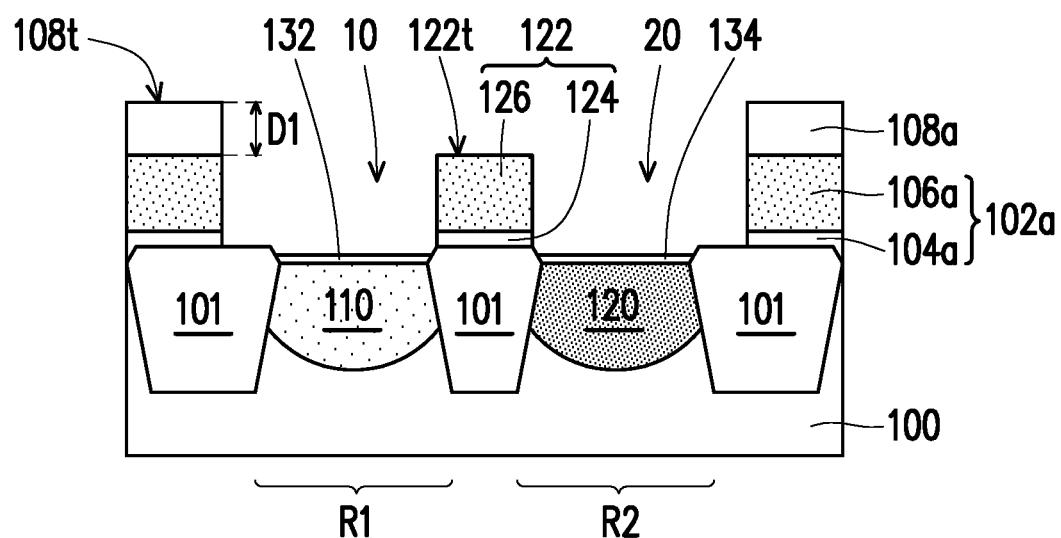

Referring to FIGS. 1F-1G and FIGS. 2F-2G, after removing the second mask pattern 114, the first barrier layer 104 not covered by the second barrier layer 106a is further removed to expose the substrate 100 of the first region R1 and the second region R2, so as to form a first opening 10 and a second opening 20. Specifically, the first opening 10 exposes the substrate 100 (or the doped region 110) of the first region R1; and the second opening 20 exposes the substrate 100 (or the doped region 120) of the second region R2. As shown in FIG. 2G, the first opening 10 and the second opening 20 are defined by the sidewalls of the patterned barrier material 102a. In the case, the patterned barrier material 102a on the isolation structure 101 between the first opening 10 and the second opening 20 may be referred to as the barrier structure 122, which includes a lower portion 124 and an upper portion 126. In some embodiments, a height difference D1 is included between a top surface 122t of the barrier structure 122 and a top surface 108t of the dielectric layer 108a. The height difference D1 is about 10 nm to 20 nm.

Referring to FIG. 1G and FIG. 2G, after removing the portion of the first barrier layer 104, a first gate dielectric layer 132 is formed on the substrate 100 in the first opening 10 and a second gate dielectric layer 134 is formed on the substrate 100 in the second opening 20. In the case, as shown in FIG. 1G, a top surface of the first gate dielectric layer 132 and a top surface of the second dielectric layer 134 is lower than the top surface of the isolation structure 101. That is, the isolation structure 101 separates the first gate dielectric layer 132 from the second gate dielectric layer 134. In one embodiment, the material of the first gate dielectric layer 134 and the second gate dielectric layer 134 includes a dielectric material, such as silicon oxide, silicon nitride, silicon oxynitride, a high-k dielectric material which may have a dielectric constant greater than 4, or a combination thereof, for example. The first gate dielectric layer 134 and the second gate dielectric layer 134 may have a thickness of about 2 nm to 7 nm, and may be formed by thermal oxidation, CVD, or a combination thereof. In some embodiments, the first gate dielectric layer 132 and the second gate dielectric layer 134 may be formed simultaneously and have a same thickness. In alternative embodiments, the first gate dielectric layer 132 and the second gate dielectric layer 134 may be formed sequentially and have different thicknesses.

Figure 1H:
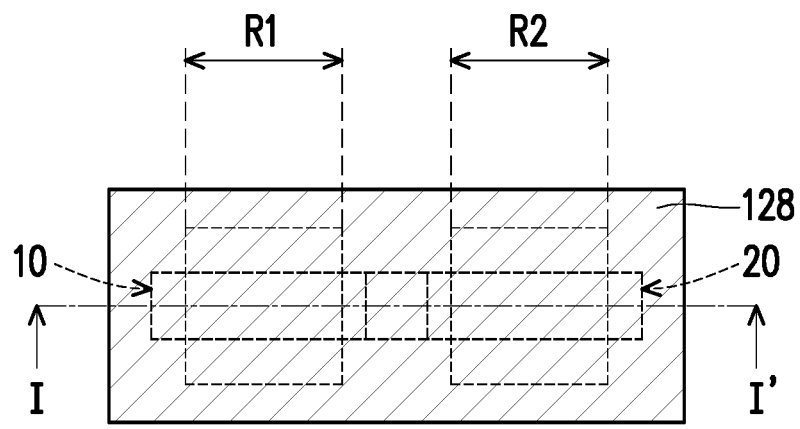
Figure 2H:
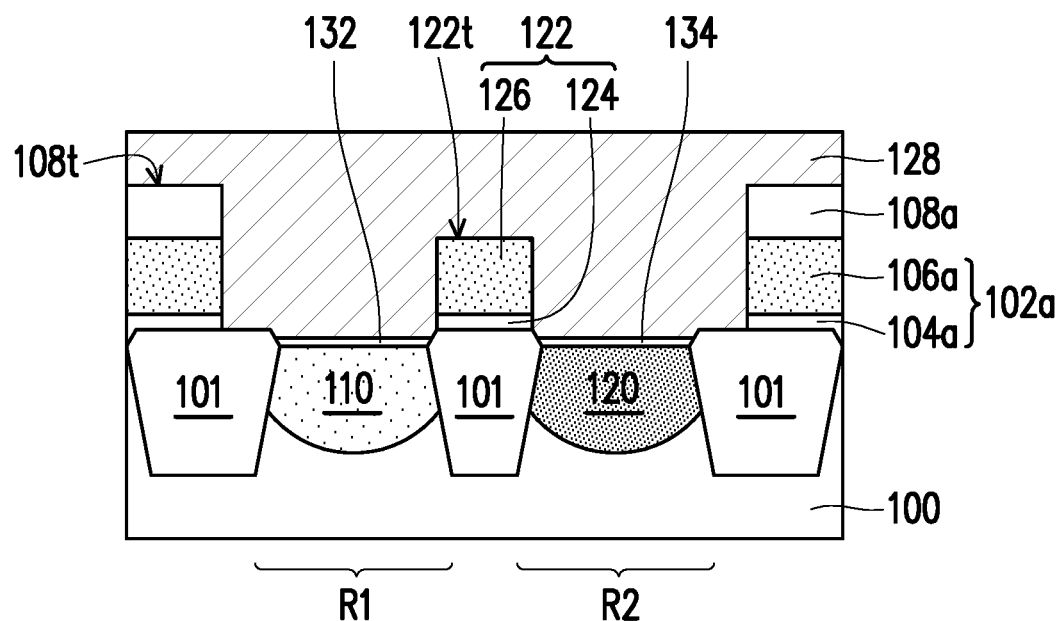
Figure 1I:
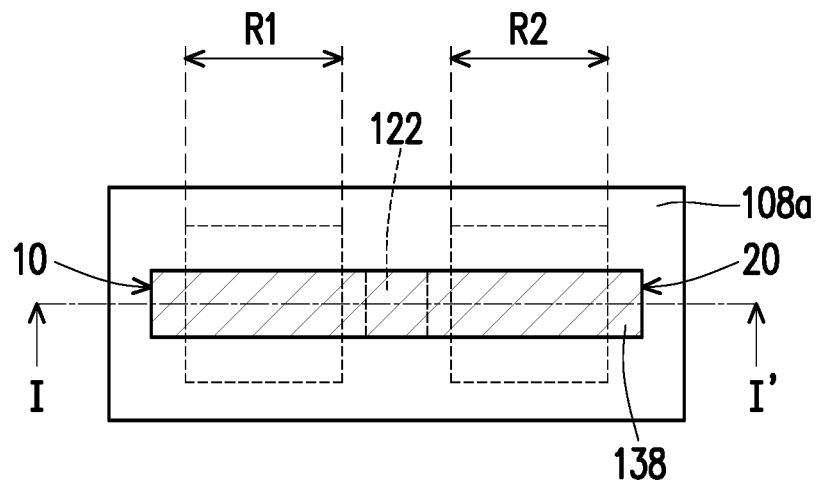

Referring to FIG. 1H and FIG. 2H, the conductive material 128 is formed blanketly. In particular, the conductive material 128 fills in the first opening 10 and the second opening 20, and covers the top surface 122t of the barrier structure 122 and the top surface 108t of the dielectric layer 108a. In one embodiment, the conductive material 128 includes a semiconductor material which may be formed by an epitaxial method, CVD, or a combination thereof. The semiconductor material may be doped polysilicon, undoped polysilicon, silicon germanium, the like, or a combination thereof, for example.

Figure 2I:
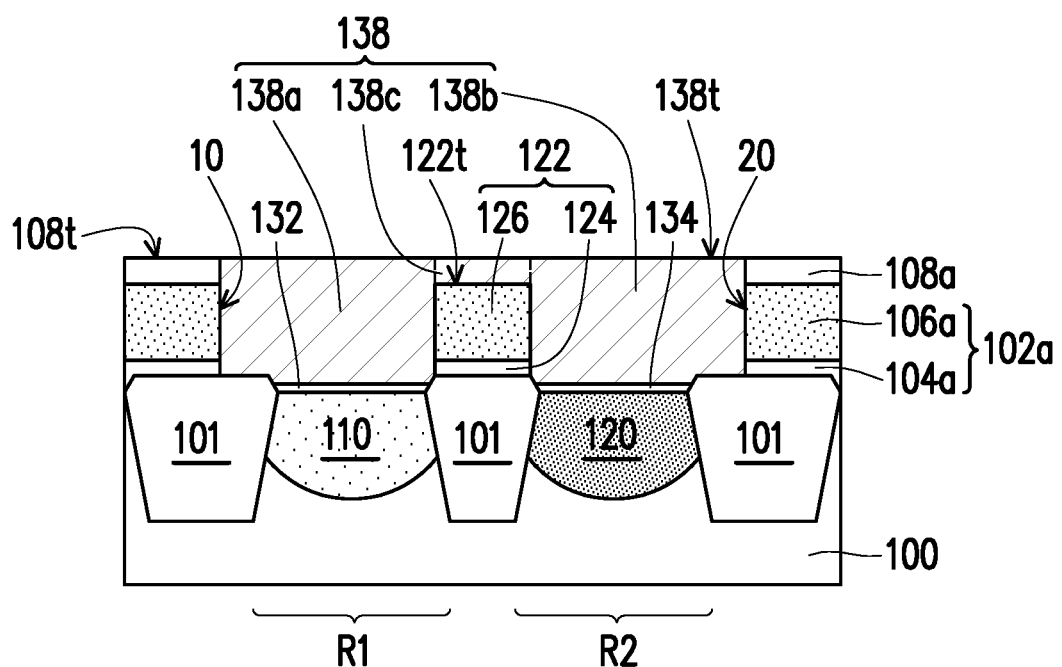
Figure 1J:
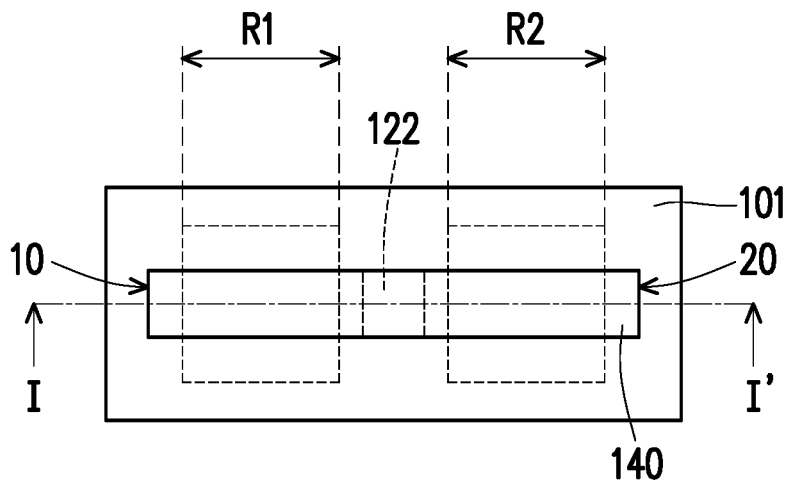

Referring to FIGS. 1H-1I and FIGS. 2H-2I, a planarization process is performed on the conductive material 128 to expose the top surface 108t of the dielectric layer 108a. In an embodiment, the planarization process may be a chemical mechanical polishing (CMP) process, an etching back process, or a combination thereof. In the case, as shown in FIG. 2I, a planarized conductive material 138 includes a first portion 138a, a second portion 138b, and a third portion 138c. Specifically, the first portion 138a is filled in the first opening 10, which may be referred to as a first conductive layer 138a. The second portion 138b is filled in the second opening 20, which may be referred to as a second conductive layer 138b. The third portion 138c may be referred to as a third conductive layer 138c, which is located between the first portion 138a and the second portion 138b and covers the top surface 122t of the barrier structure 122. In some embodiments, the dielectric layer 108a may be referred to as a polishing stop layer or an etching stop layer of the planarization process. In other embodiments, the top surface 138t of the conductive material 138 is substantially coplanar with the top surface 108t of the dielectric layer 108a, after the planarization process. In alternative embodiments, the top surface 138t of the conductive material 138 is higher than the top surface 122t of the barrier structure 122. In addition, during the planarization process, a portion of the dielectric layer 108a is also consumed, so that the thickness of the dielectric layer 108a becomes thinner.

Referring to FIGS. 1I-1J and FIGS. 2I-2J, the first conductive layer 138a is doped as a N-type conductive layer 142 (hereinafter referred to as a first conductive layer 142), and the second conductive layer 138b is doped as a P-type conductive layer 144 (hereinafter referred to as a second conductive layer 144). Specifically, in an embodiment, a photoresist pattern (not shown) may be formed on the conductive material 138 to expose the first conductive layer 138a, and a first ion implantation process is then performed on the first conductive layer 138a. The first ion implantation process may be implanted with an N-type dopant such as phosphorus, arsenic or antimony (Sb), and may have a doping concentration may be $5.5 \times 10^{15}/cm^3$ to $6.5 \times 10^{15}/cm^3$, for example. In another embodiment, another photoresist pattern (not shown) may be formed on the conductive material 138 to expose the second conductive layer 138b, and a second ion implantation process is then performed on the second conductive layer 138b. The second ion implantation process may be implanted with a P-type dopant such as boron or indium (In), and may have a doping concentration $3.0 \times 10^{15}/cm^3$ to $5.0 \times 10^{15}/cm^3$, for example. In alternative embodiments, the first ion implantation process may be performed before or after the second ion implantation process.

After performing the first ion implantation process and the second ion implantation process, an annealing process is performed to drive the N-type dopant and the P-type dopant into lower portions of the first conductive layer 142 and the second conductive layer 144, respectively, so as to increase the doping concentration of the lower portions of the first conductive layer 142 and the second conductive layer 144. In this way, the depletion layers located between the first conductive layer 142 and the first gate dielectric layer 132 and between the second conductive layer 144 and the second gate dielectric layer 134 may be removed, thereby reducing the effective dielectric thickness and increasing the saturation current. In the case, portions of the N-type dopant and the P-type dopant are also driven into the third conductive layer 146 between the first conductive layer 142 and the second conductive layer 144, respectively. That is, the third conductive layer 146 has the N-type dopant and has the P-type dopant as well.

It should be noted that, in the embodiment, the barrier structure 122 is formed between the first region R1 (or NMOS region domain) and the second region R2 (PMOS region domain). Therefore, the present embodiment is able to reduce the inter-diffusion between the first conductive layer 142 (which may be referred to as the gate of the NMOS device) and the second conductive layer 144 (which may be referred to as the gate of the PMOS device) while maintaining the chip usage area of the semiconductor device, thereby improving the control of the threshold voltage. As a result, the ability to miniaturize the semiconductor device is accordingly enhanced. In addition, in the present embodiment, the first conductive layer 142 and the second conductive layer 144 are also formed by a damascene process to avoid the plasma induced damage (PID), thereby improving the product reliability.

Figure 2J:
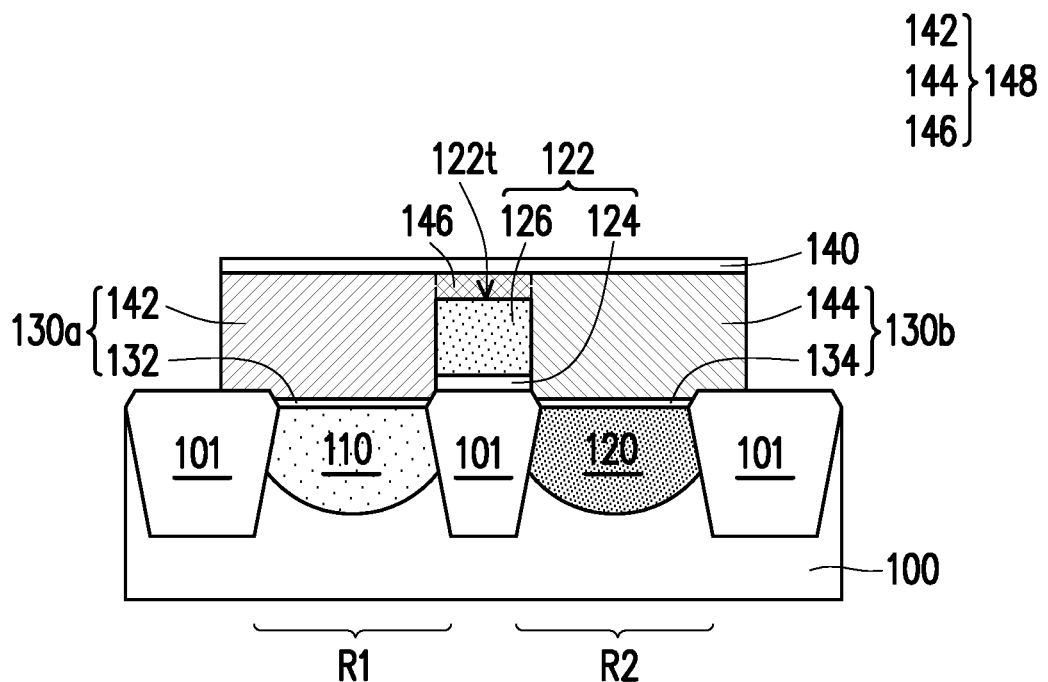

As shown in FIG. 2J, a metal silicide layer 140 may be formed on a doped conductive structure 148 after performing the annealing process. In some embodiments, the material of the metal silicide layer 140 may be nickel silicide (NiSi), cobalt silicide (CoSi), titanium silicide (TiSi), tungsten silicide (WSi), molybdenum silicide (MoSi), platinum silicide (PtSi), palladium silicide (PdSi) or a combination thereof, for example. The forming method of the metal silicide layer 140 are well known to those skilled in the art and will not be described in detail herein.

As shown in FIG. 2J, after forming the metal silicide layer 140, a wet etching process is performed to remove the dielectric layer 108a and the underlying second barrier layer 106a and the first barrier layer 104a, so as to expose the isolation structure 101. In some embodiments, the wet etching process includes a plurality of etching steps to sequentially remove the dielectric layer 108a, the second barrier layer 106a, and the first barrier layer 104a. For example, a dilute hydrofluoric acid (DHF) solution may be used to remove the uppermost dielectric layer 108a, a hot phosphoric acid solution is then applied to remove the second barrier layer 106a, and another DHF solution is finally used to remove the lowermost first barrier layer 104a. It should be noted that the stacked structure constituted of the dielectric layer 108a, the second barrier layer 106a, and the first barrier layer 104a has a high etching selectivity ratio with the doped conductive structure 148 and the metal silicide layer 140. Therefore, the doped conductive structure 148 and the metal silicide layer 140 are not consumed or only slightly consumed, when the stacked structure constituted of the dielectric layer 108a, the second barrier layer 106a, and the first barrier layer 104a is removed.

Referring to FIG. 2J, the semiconductor device fabricated by the foregoing method includes the substrate 100, the isolation structure 101, the doped regions 110, 120, the barrier structure 122, the first gate dielectric layer 132, the first conductive layer 142, the second gate dielectric layer 134, and the second conductive layer 144. Specifically, the isolation structure 101 is located in the substrate 100 to divide the substrate 100 into the first region R1 and the second region R2. The doped region 110 is located in the substrate 100 of the first region R1 to form the NMOS region. The doped region 120 is located in the substrate 100 of the second region R2 to form a PMOS region.

As shown in FIG. 2J, the barrier structure 122 is located on the isolation structure 101 between the first region R1 and the second region R2. The first conductive layer 142 is located on the substrate 100 in the first region R1, and the first gate dielectric layer 132 is located between the first conductive layer 142 and the substrate 100 in the first region R1. In an embodiment, the first gate dielectric layer 132 and the first conductive layer 142 thereon may be considered as a first gate structure 130a. The second conductive layer 144 is located on the substrate 100 in the second region R2, and the second gate dielectric layer 134 is located between the second conductive layer 144 and the substrate 100 in the second region R2. In another embodiment, the second gate dielectric layer 134 and the second conductive layer 144 thereon may be considered as a second gate structure 130b.

It should be noted that the barrier structure 122 separates the first conductive layer 142 from the second conductive layer 144, which may decrease the inter-diffusion between the first conductive layer 142 (which may be referred to as a gate of the NMOS device) and the second conductive layer 144 (which may be referred to as a gate of the PMOS device), thereby improving the control of the threshold voltage. In particular, the barrier structure 122 includes a lower portion 124 and an upper portion 126. In some embodiments, the lower portion 124 and the upper portion 126 have different dielectric materials. For example, the lower portion 124 may be a silicon oxide layer; and the upper portion 126 may be a silicon nitride layer. In alternative embodiments, the barrier structure 122 has sidewalls that are substantially perpendicular to the top surface of the substrate 100.

As shown in FIG. 2J, the first conductive layer 142 and the second conductive layer 144 are connected by the third conductive layer 146 to form a continuous conductive structure 148. The conductive structure 148 traverses or is across the barrier structure 122 to cover the first gate dielectric layer 132 and the second gate dielectric layer 134. In some embodiments, since the first conductive layer 142 and the second conductive layer 144 are formed by the damascene process, both of the first conductive layer 142 and the second conductive layer 144 have the sidewalls substantially perpendicular to the top surface of the substrate 100. In addition, the semiconductor device of the present embodiment further includes the metal silicide layer 140 located on the first conductive layer 142, the second conductive layer 144, and the third conductive layer 146 to reduce the impedances of the first conductive layer 142 and the second conductive layer 144.

Figure 3:
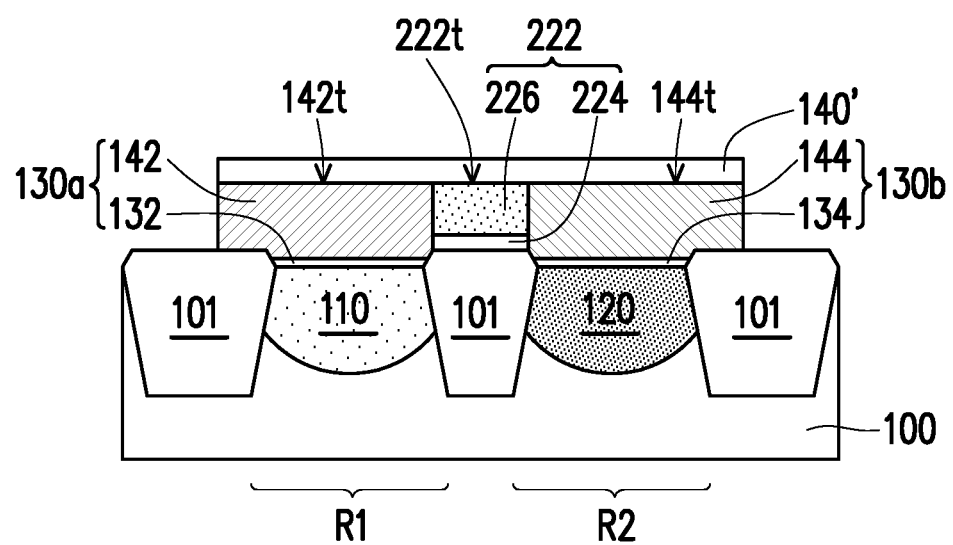
FIG. 3 is a schematic cross-sectional view illustrating a semiconductor device according to a second embodiment of the disclosure.
Figure 4A:
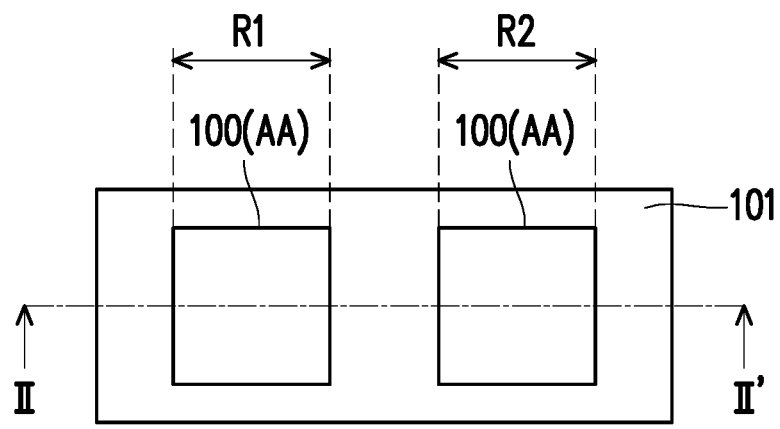
FIG. 4A to FIG. 4J are schematic top views illustrating a method of manufacturing the semiconductor device according to the second embodiment of the disclosure.
Figure 4B:
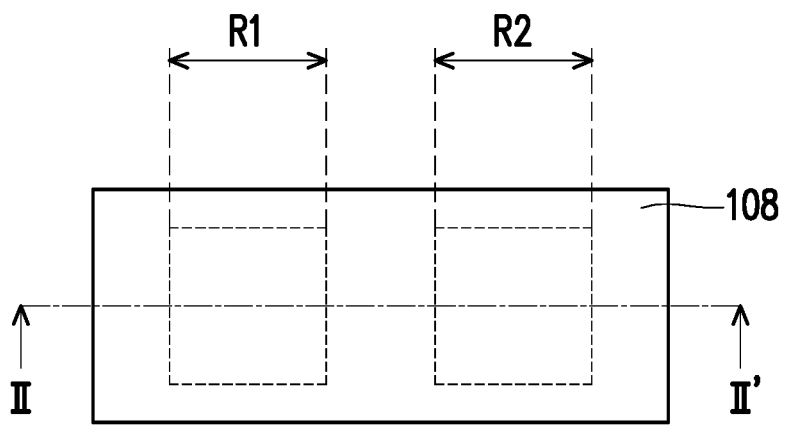
Figure 4C:
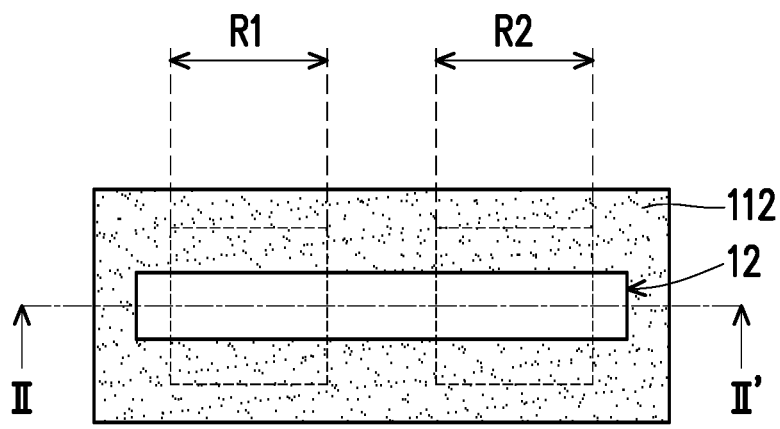
Figure 4D:
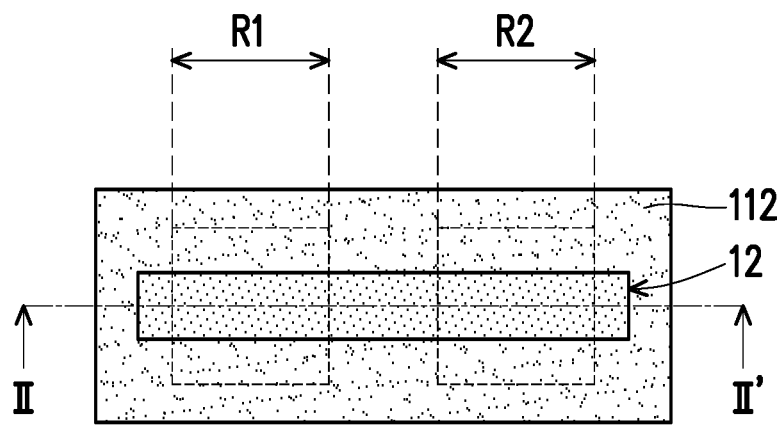

FIG. 3 is a schematic cross-sectional view illustrating a semiconductor device according to a second embodiment of the disclosure.

Referring to FIG. 3, the semiconductor device of the second embodiment is similar to the semiconductor device of the first embodiment basically, basically. A difference therebetween lies in that the semiconductor device of the second embodiment does not have the third conductive layer 146 illustrated in FIG. 2J. That is, as shown in FIG. 3, the top surface 142t of the first conductive layer 142, the top surface 144t of the second conductive layer 144, and the top surface 222t of the barrier structure 222 are substantially coplanar, and the metal silicide layer 140' directly contacts the top surface 142t of the first conductive layer 142, the top surface 144t of the second conductive layer 144, and the top surface 222t of the barrier structure 222.

Specifically, the method of manufacturing the semiconductor device of the second embodiment includes following steps.

FIG. 4A to FIG. 4J are schematic top views illustrating a method of manufacturing the semiconductor device according to the second embodiment of the disclosure. FIG. 5A to FIG. 5J are schematic cross-sectional views respectively taken along line II-II' of FIG. 4A to FIG. 4J.

Referring to FIGS. 4A-4C and FIG. 5A-5C, basically, the steps illustrated in FIGS. 4A-4C and FIGS. 5A-5C are similar to the steps illustrated in FIGS. 1A-1C and FIGS. 2A-2C, and the detail steps have been described in detail in the above embodiments. Thus, details thereof are omitted here.

Figure 5A:
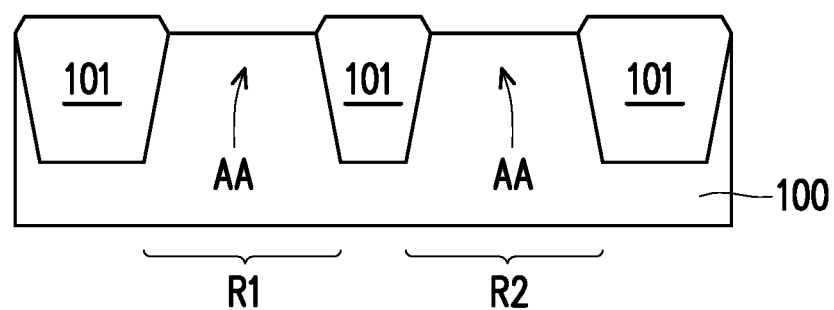
FIG. 5A to FIG. 5J are schematic cross-sectional views respectively taken along line II-II' of FIG. 4A to FIG. 4J.
Figure 5B:
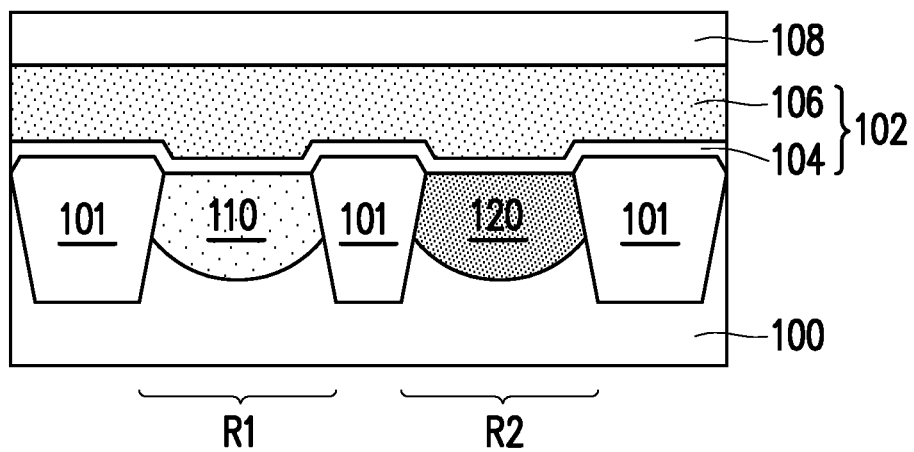
Figure 5C:
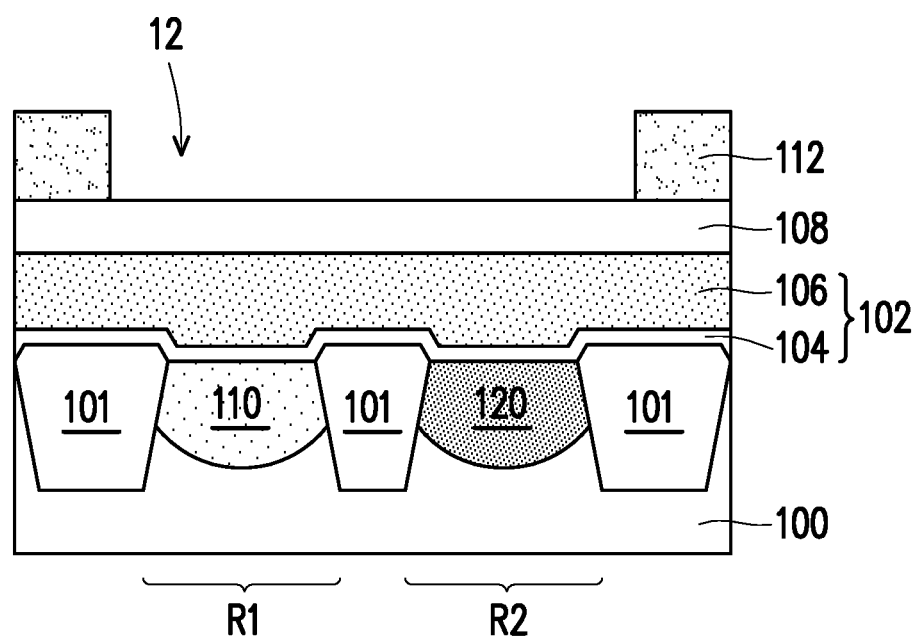
Figure 5D:
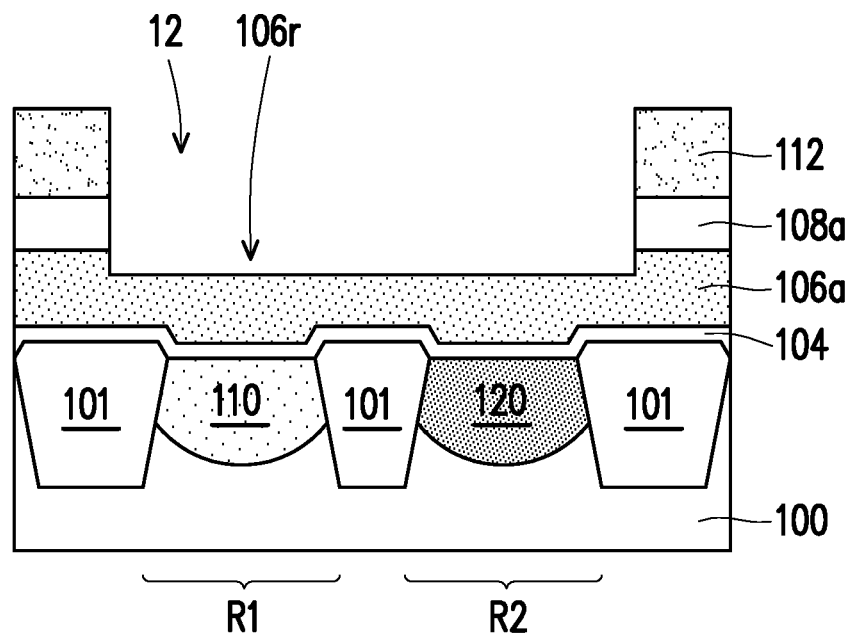

Referring to FIGS. 4C-4D and FIGS. 5C-5D, a first etching process is performed by using a first mask pattern 112 as an etching mask, and a portion of a dielectric layer 108 is removed, so as to expose a second barrier layer 106. In the present embodiment, a portion of the second barrier layer 106 is also removed to form a recess 106r on a recessed second barrier layer 106a. That is, a thickness of the second barrier layer 106a exposed by the first mask opening 12 is decreased. In some embodiments, as shown in FIG. 5D, the thickness of the second barrier layer 106a covered by the dielectric layer 108a is greater than the thickness of the second barrier layer 106a not covered by the dielectric layer 108a.

Figure 4E:
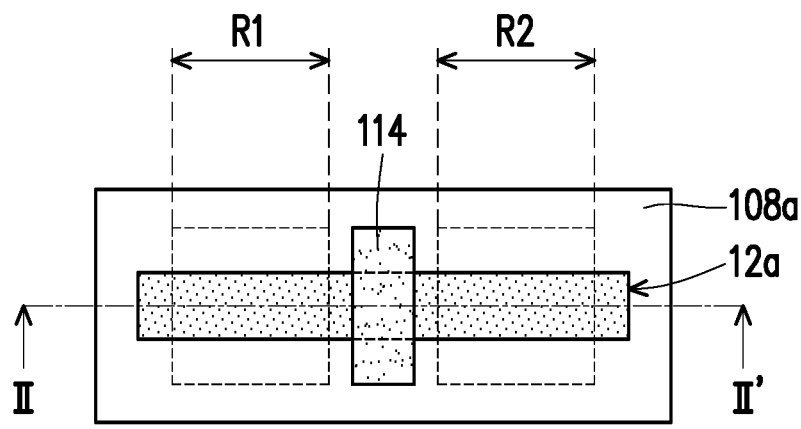
Figure 5E:
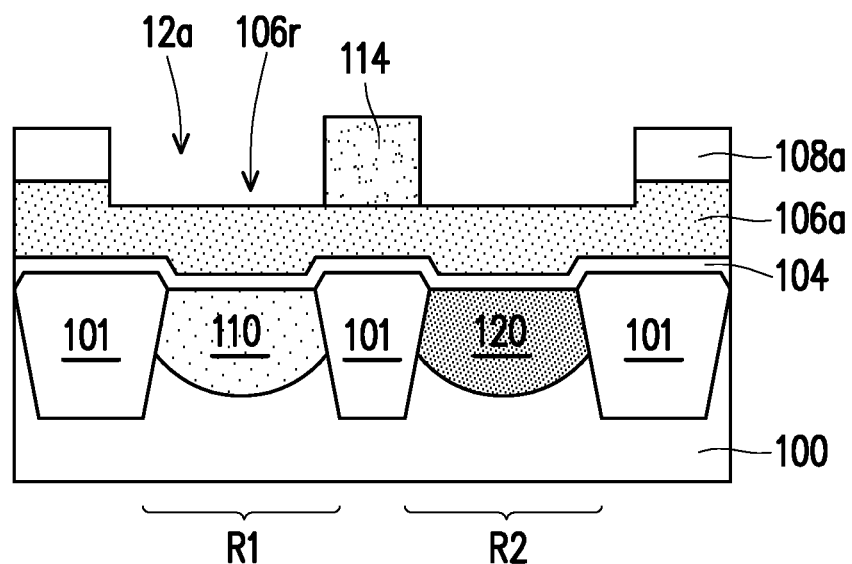
Figure 5F:
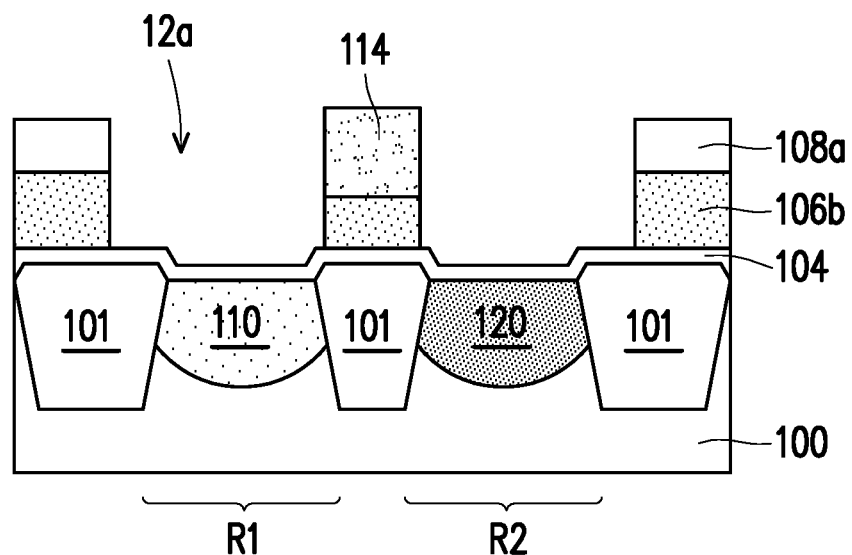

Referring to FIGS. 4E and 5E, a second mask pattern 114 is formed on the recessed second barrier layer 106a or in the recess 106r. As shown in the top view 4E, the second mask pattern 114 is located between the first region R1 and the second region R2 and is across the first mask opening 12a. Herein, the first mask opening 12a is defined by the dielectric layer 108a. As shown in the cross-sectional view 5E, the second mask pattern 114 corresponds to the isolation structure 101 between the first region R1 and the second region R2.

Referring to FIGS. 4E-4F and FIGS. 5E-5F, a second etching process is performed by using the second mask pattern 114 and the dielectric layer 108a as an etching mask, and a portion of the second barrier layer 106a is removed to expose the first barrier layer 104. In the embodiment, the first barrier layer 104 may be referred to as an etching stop layer of the second etching process.

Figure 4F:
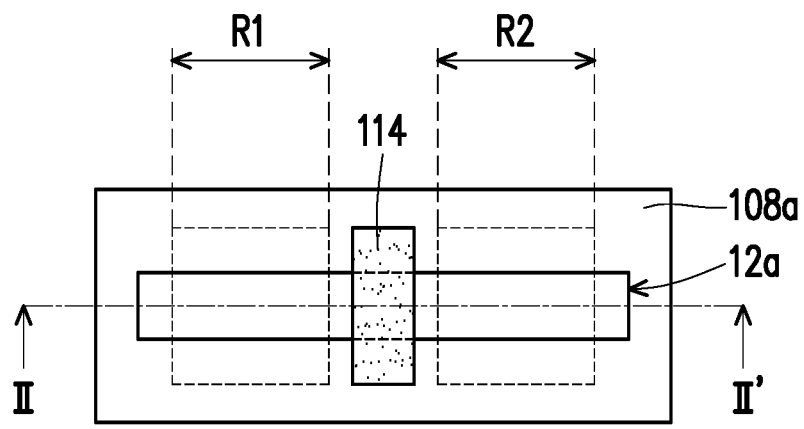
Figure 4G:
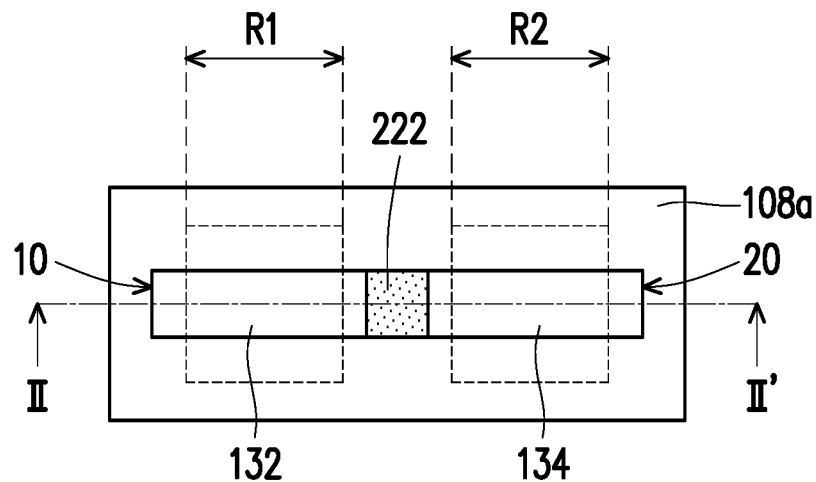
Figure 5G:
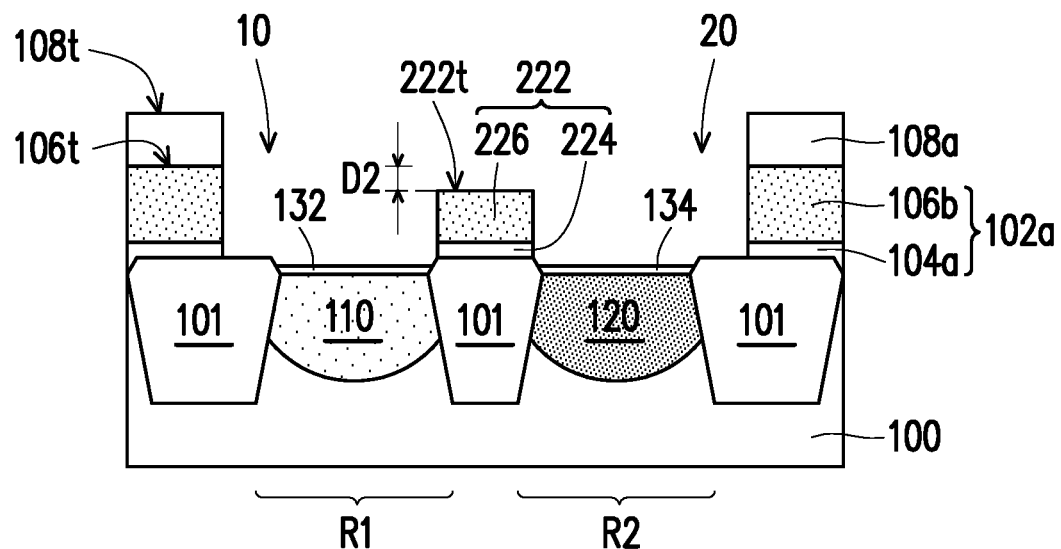

Referring to FIGS. 4F-4G and FIGS. 5F-5G, after removing the second mask pattern 114, the first barrier layer 104 not covered by the second barrier layer 106b is removed to expose the substrate 100 of the first region R1 and the second region R2, thereby forming a first opening 10 and a second opening 20. Specifically, the first opening 10 exposes the substrate 100 (or the doped region 110) in the first region R1; and the second opening 20 exposes the substrate 100 (or the doped region 120) in the second region R2. As shown in FIG. 5G, the first opening 10 and the second opening 20 are defined by the sidewalls of the patterned barrier material 102a. In the case, the patterned barrier material 102a on the isolation structure 101 located between the first opening 10 and the second opening 20 may be referred to as a barrier structure 222, which includes a lower portion 224 and an upper portion 226. In some embodiments, a height difference D2 is included between the top surface 222t of the barrier structure 222 and the top surface 106t of the second barrier layer 106b. The height difference D2 is about 10 nm to 20 nm. In alternative embodiments, the thickness of the upper portion 226 of the barrier structure 222 is less than the thickness of the second barrier layer 106b.

Referring to FIG. 4G and FIG. 5G, after removing the portion of the first barrier layer 104, a first gate dielectric layer 132 is formed on the substrate 100 in the first opening 10 and a second gate dielectric layer 134 is formed on the substrate 100 in the second opening 20. In the case, as shown in FIG. 5G, the top surface of the first gate dielectric layer 132 and the top surface of the second gate dielectric layer 134 are lower than the top surface of the isolation structure 101. That is, the isolation structure 101 separates the first gate dielectric layer 132 from the second gate dielectric layer 134.

Figure 4H:
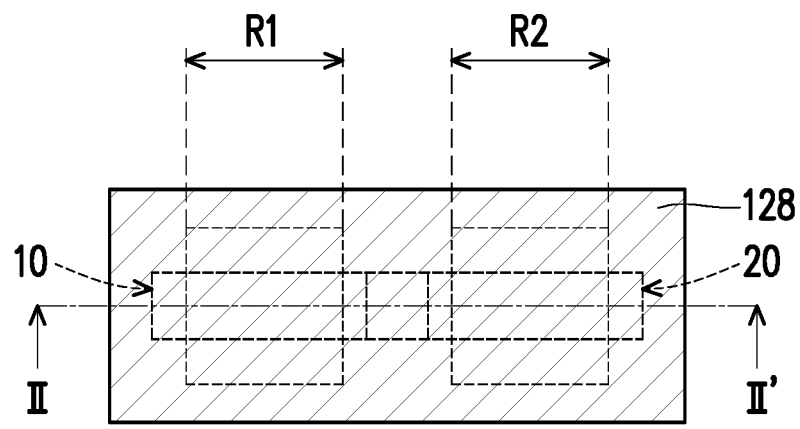
Figure 5H:
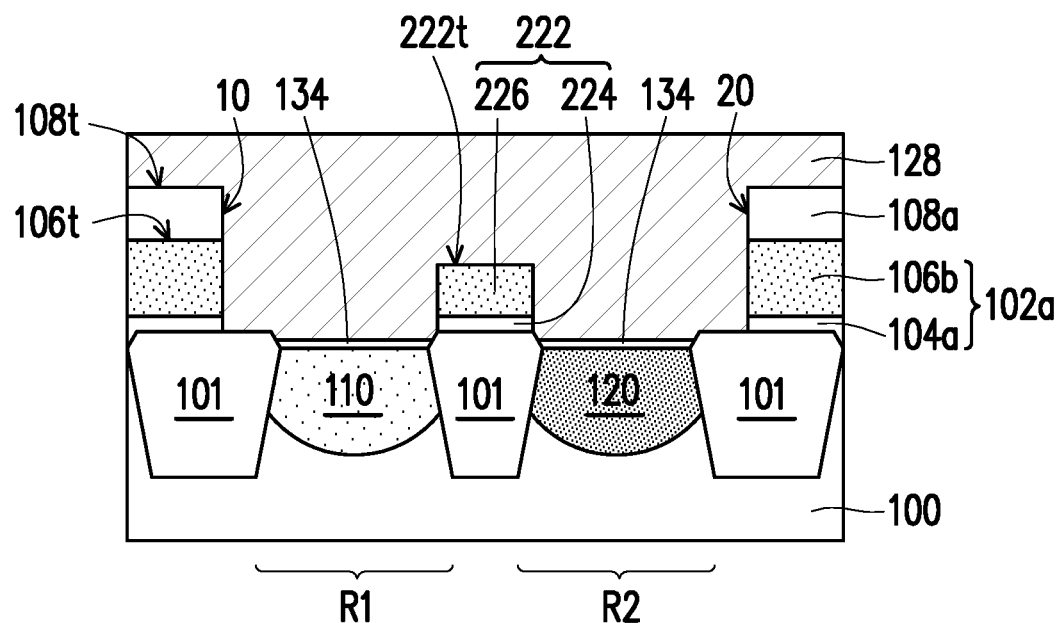
Figure 4I:
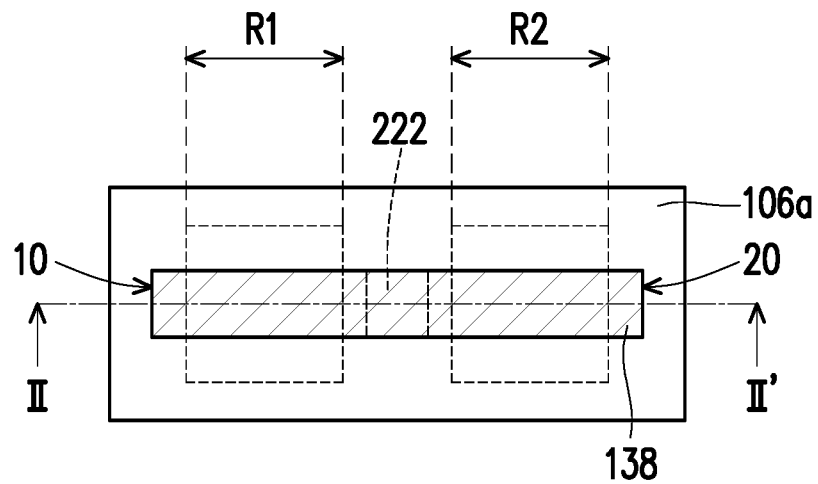

Referring to FIGS. 4H and 5H, a conductive material 128 is formed blanketly. Specifically, the conductive material 128 fills in the first opening 10 and the second opening 20 to cover the top surface 222t of the barrier structure 222 and the top surface 108t of the dielectric layer 108a.

Figure 5I:
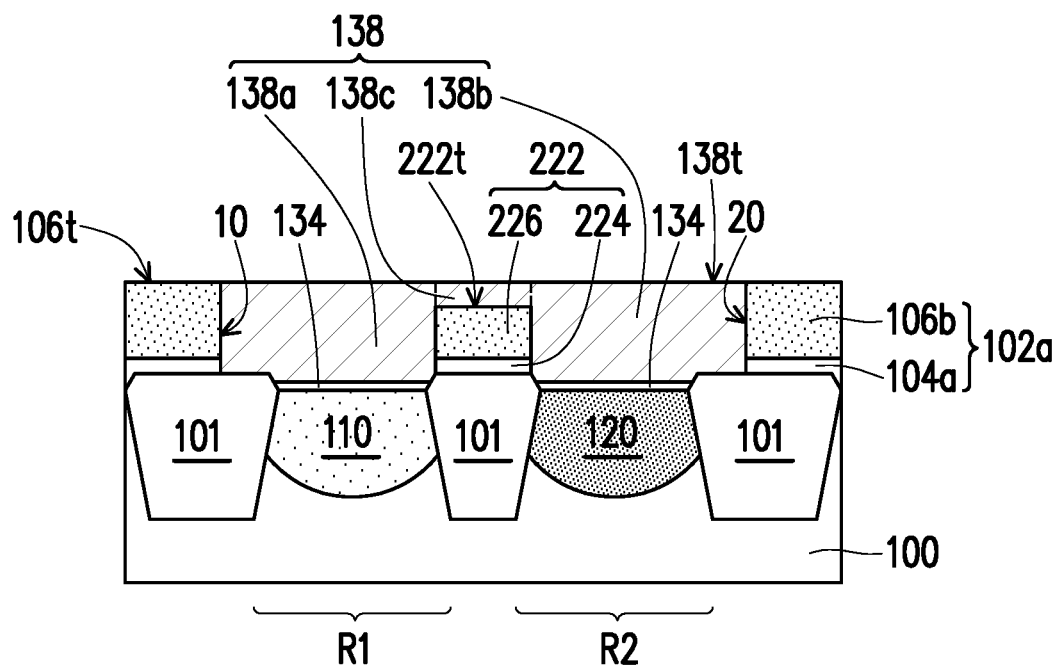
Figure 4J:
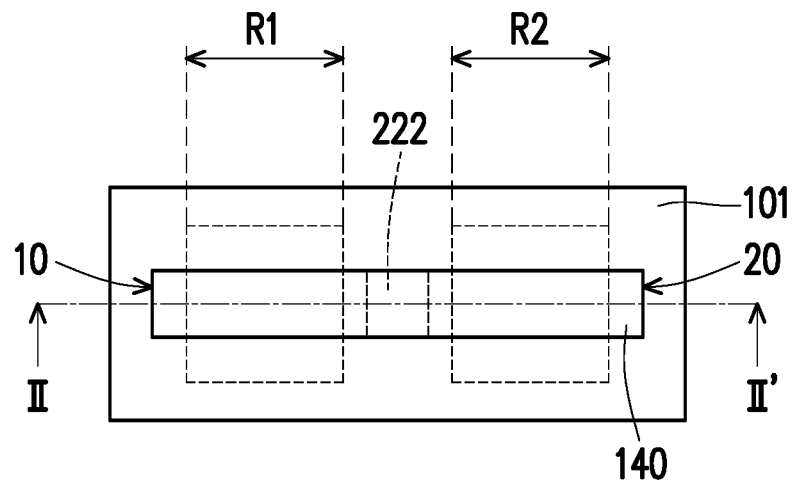

Referring to FIGS. 4H-4I and FIGS. 5H-5I, a planarization process is performed on the conductive material 128 to expose the top surface 106t of the second barrier layer 106b. In the case, as shown in FIG. 5I, a planarized conductive material 138 includes a first portion 138a, a second portion 138b, and a third portion 138c. Specifically, the first portion 138a is filled in the first opening 10, which may be referred to as a first conductive layer 138a. The second portion 138b is filled in the second opening 20, which may be referred to as a second conductive layer 138b. The third portion 138c may be referred to as a third conductive layer 138c, which is located between the first portion 138a and the second portion 138b and covers the top surface 222t of the barrier structure 222. In some embodiments, the second barrier layer 106b may be referred to as a polishing stop layer or an etching stop layer of the planarization process. In other embodiments, the top surface 138t of the conductive material 138 is substantially coplanar with the top surface 106t of the second barrier layer 106b, after the planarization process.

Referring to FIGS. 4I-4J and FIGS. 5I-5J, the first conductive layer 138a is doped as a N-type conductive layer 142 (hereinafter referred to as a first conductive layer 142), and the second conductive layer 138b is doped as a P-type conductive layer 144 (hereinafter referred to as a second conductive layer 144). An annealing process is then performed to drive the N-type dopant and the P-type dopant into lower portions of the first conductive layer 142 and the second conductive layer 144, respectively.

Figure 5J:
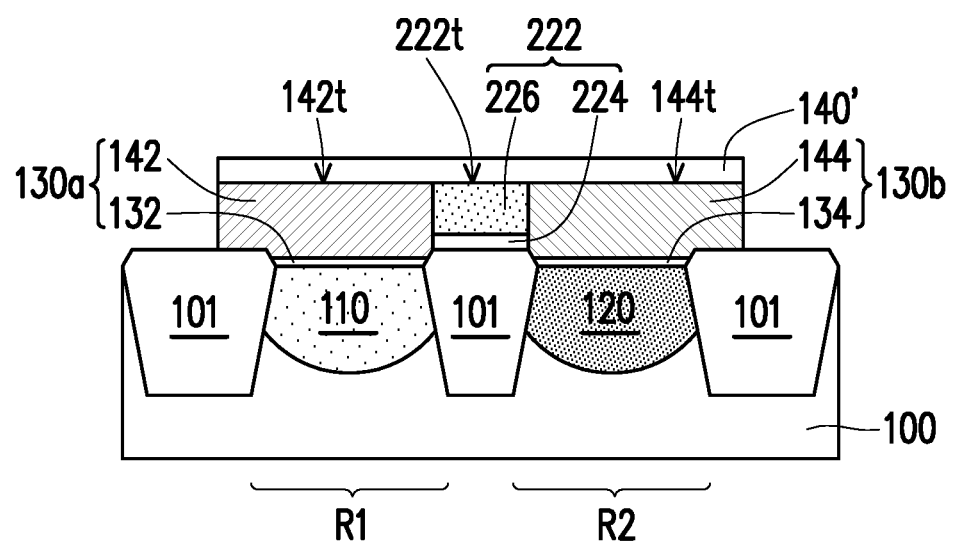

As shown in FIG. 5J, after performing the annealing process, a metal silicidation process is performed to form a metal silicide layer 140' on the first conductive layer 142, the second conductive layer 144, and the barrier structure 222. In some embodiments, the steps of the metal silicidation process includes: depositing a metal layer and then performing a heating process so that the metal layer reacts with the portion of the conductive layer, thereby forming the metal silicide layer 140'. In the present embodiment, the third conductive layer 138c on the barrier structure 222 (as shown in FIG. 5I) would react with the metal layer, so that the metal silicide layer 140' is fully silicided. In the case, the metal silicide layer 140' covers and directly contacts the top surface 142t of the first conductive layer 142, the top surface 144t of the second conductive layer 144, and the top surface 222t of the barrier structure 222.

Based on the above, in the present invention, the barrier structure is formed between the NMOS region and the PMOS region. In the case, the present invention is able to prevent the inter-diffusion between the gate of the NMOS device and the gate of the PMOS device while maintaining the chip usage area of the semiconductor device, thereby improving the control of the threshold voltage. As a result, the ability to miniaturize semiconductor devices is accordingly enhanced. In addition, in the present invention, the gate structure is also formed in the NMOS region and the PMOS region by a damascene process to avoid the plasma induced damage (PID), thereby improving the product reliability.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
   a substrate, having a first region and a second region;
   an isolation structure, disposed in the substrate between the first region and the second region;
   a barrier structure, disposed on the isolation structure;
   a first conductive layer, disposed on the first region;
   a second conductive layer, disposed on the second region;
   a first gate dielectric layer, disposed between the first conductive layer and the substrate in the first region; and
   a second gate dielectric layer, disposed between the second conductive layer and the substrate in the second region, wherein the isolation structure separates the first gate dielectric layer from the second gate dielectric layer, wherein the barrier structure comprises a lower portion and an upper portion on the lower portion, the lower portion has a first sidewall aligned with a second sidewall of the upper portion in a direction perpendicular to a top surface of the substrate, and the first sidewall and the second sidewall are both in physical contact with the first conductive layer or the second conductive layer.

2. The semiconductor device of claim 1, wherein the lower portion and the upper portion have different dielectric materials.

3. The semiconductor device of claim 1, wherein the barrier structure separates the first conductive layer from the second conductive layer, and a top surface of the first conductive layer, a top surface of the second conductive layer, and a top surface of the barrier structure are substantially coplanar.

4. The semiconductor device of claim 1, further comprising:
   a third conductive layer disposed on the barrier structure and connected to the first and second conductive layers to form a continuous conductive structure; and
   a metal silicide layer disposed on the continuous conductive structure.

5. The semiconductor device of claim 4, wherein the continuous conductive structure comprises:
   the first conductive layer, having a N-type dopant;
   the second conductive layer, having a P-type dopant; and
   the third conductive layer, disposed between the first conductive layer and the second conductive layer, and having the N-type dopant and the P-type dopant.

6. The semiconductor device of claim 1, further comprising a metal silicide layer disposed on the first conductive layer, the second conductive layer, and the barrier structure.

7. A manufacturing method of a semiconductor device, comprising:
   forming an isolation structure in a substrate to divide the substrate into a first region and a second region;
   blanketly forming a barrier material on the substrate;
   forming a first mask pattern on the barrier material;
   performing a first etching process by using the first mask pattern as an etching mask, so as to form a recess on the barrier material;
   forming a second mask pattern in the recess;
   performing a second etching process by using the second mask pattern as an etching mask, so as to form a first opening and a second opening which respectively expose the substrate in the first region and the second region, and
   a barrier structure between the first opening and the second opening;
   forming a first gate dielectric layer in the first opening and forming a second gate dielectric layer in the second opening;
   forming a conductive material to fill in the first opening and the second opening; and
   performing a planarization process on the conductive material to form a first conductive layer in the first opening and form a second conductive layer in the second opening.

8. The manufacturing method of the semiconductor device of claim 7, wherein after the planarization process is performed on the conductive material, the first conductive layer is formed in the first opening, the second conductive layer is formed in the second opening, and a third conductive layer is formed on the barrier structure simultaneously, wherein the third conductive layer is connected to the first and second conductive layers to form a continuous conductive structure.

9. The manufacturing method of the semiconductor device of claim 7, further comprising:
   performing a first ion implantation process to dope the first conductive layer as N-type;
   performing a second ion implantation process to dope the second conductive layer as P-type; and
   forming a metal silicide layer on the first conductive layer, the second conductive layer, and the barrier structure.

* * * * *